United States Patent [19]

Gruss et al.

[11] Patent Number: 4,634,603

[45] Date of Patent: Jan. 6, 1987

[54] METHOD OF ABRASIVE CLEANING AND SPRAY COATING

[75] Inventors: Alder R. Gruss, New Rochelle, N.Y.; Theodore A. Shapiro, West Haven, Conn.

[73] Assignee: United Technologies Corporation, Hartford, Conn.

[21] Appl. No.: 725,848

[22] Filed: Apr. 22, 1985

[51] Int. Cl.⁴ ................. B05D 1/06; B05D 1/34; B05D 3/12
[52] U.S. Cl. ................................. 427/96; 427/195; 427/289; 427/426
[58] Field of Search .............. 427/289, 426, 195, 96; 51/319, 321

[56] References Cited

U.S. PATENT DOCUMENTS 4,517,248  5/1985  Kik et al. ........................ 427/426
4,535,576  8/1985  Shukla et al. ................... 51/319 X

OTHER PUBLICATIONS

"Tiny Bubbles Beef up Plastics, Cut Costs and Reduce Weight," Design Engineering Feature, *Product Engineering*, Oct. 1977, p. 39.

Ingulli, C. N., "Abrasive Jet Machining", The Tool and Manufacturing Engineer, Nov. 1967, pp. 2830-2831.

*Primary Examiner*—Evan K. Lawrence
*Attorney, Agent, or Firm*—Alan C. Cohen; E. Richard Skula

[57] ABSTRACT

A method of abrading and simultaneously coating at least one surface of an article, particularly a circuit board assembly. The method comprises introducing abrasive particles into the compressed gas supply of a spray gun. The resulting gas stream with entrained abrasive particles is transported to and emitted from at least one spray nozzle of the spray gun where it is directed to the surface of the article with a film-forming coating composition stream also directed to and emitted from at least one nozzle of the spray gun. The abrasive particles can be simultaneously sprayed along with the optional coating composition onto the surface (these abrasive particles being microballoons in the case of a circuit board assembly). The surface is abraded while the coating is being applied. The resulting coating is substantially free of abrasive articles and has good adherence to the surface. The abrasive-containing compressed gas stream cleans and abrades the surface of the article, thereby preparing the surface to receive a coating.

4 Claims, 1 Drawing Figure

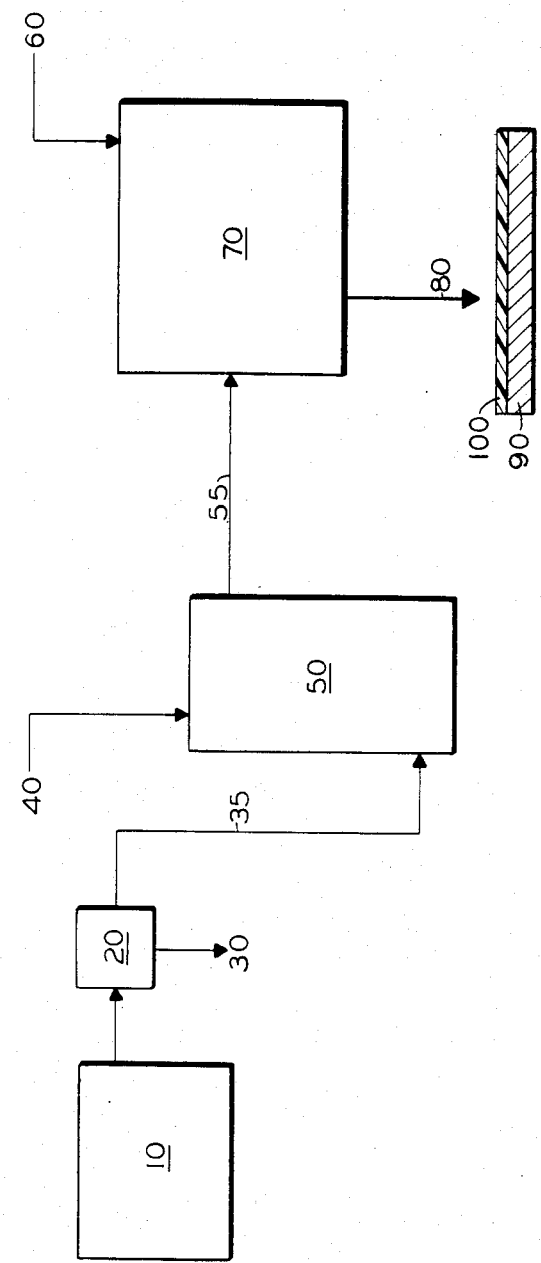

METHOD OF ABRASIVE CLEANING AND SPRAY COATING

TECHNICAL FIELD

The field of art to which this invention relates is protective coatings and abrasive cleaning, specifically a method of simultaneously abrading a surface, particularly the surface of a circuit board assembly, while applying a film-forming composition.

BACKGROUND ART

It is known in the art that in order to get acceptable adhesion of a coating to a surface, the surface must typically be pretreated in some manner. The pretreatment can take the form of chemical treatment or mechanical treatment, or a combination thereof. The primary purpose of the pretreatment is to remove surface impurities or contaminants which can either prevent the coating from adhering, or can result in a corrosive substance being locked-in between the interface of the coating and the surface.

Chemical treatments which have been used to prepare surfaces for coatings include solvents such as trichloroethane, caustics, high purity distilled or deionized water, soaps, detergents, acids, etc. In the automobile industry, for example, it is common to pretreat metal surfaces with a phosphatizing composition prior to coating.

It is also common in preparing metal surfaces for primers and/or protective coatings to mechanically abrade surfaces to remove oxidized metal, surface impurities, and contaminants.

An example of a mechanical abrasive treatment is sand blasting. This is typically done by entraining an abrasive material such as slag or sand in a high velocity air stream to impart sufficient energy to the particles such that upon impact they will abrade the surface of the metal and remove the surface layer of oxidized metal, surface impurities, or contaminants. The abrasive particles are, typically, continuously recycled. In such an abrasive process, it is important to paint the bare metal surface as soon as possible after abrasion to prevent a new oxidized layer from forming at the surface and to minimize other surface contaminants.

U.S. Pat. No. 2,703,550 discloses a process for removing scale deposits from wire. The wire is passed through a rotating steel drum containing steel balls which rub the wire clean of scale deposits. U.S. Pat. No 4,244,989 discloses a method of abrading and rust proofing by using dry abrasive particles coated with a rust proofing composition such as a resin binder. U.S. Pat. No. 3,498,768 discloses a method of abrasive blasting and applying a rust inhibitor. The process uses dry fatty acid coated abrasive particles as a rust inhibitor. The blasted surface is prevented from oxidizing by the rust inhibitor.

U.S. Pat. No. 4,091,125 discloses a method of roughening copper foil in the manufacture of printed circuit boards by using a mechanical abrading process. A pressurized air and grit mixture is sprayed from a nozzle onto a copper foil so that the abraded surface will adhere to a resin impregnated substrate.

Japanese Patent No. 57-126972 relates to a method of matting a surface by applying a paint containing a matting agent.

As previously mentioned, there are several reasons why it is necessary to pretreat a surface prior to applying a coating. First of all, there may be residual contaminants on the surface, as the result of manufacturing processes or oxidation, which must be removed in order for the coating to adhere. Secondly, it may be necessary to remove corrosive contaminants so that they will not be locked in by the application of the coating. Finally, the surface may be inherently slippery, or slippery due to residual contaminants, and it may be necessary to roughen or abrade the surface in order for the coating to properly adhere.

In the electronics industry, it is frequently necessary to apply conformal coatings to assembled circuit boards. An assembled printed circuit board (circuit board assembly) consists of various types of electrical and electronic components soldered into a printed circuit board. The conformal coatings are typically resinous compositions such as urethanes, epoxys, polyesters, alykds, acrylics, etc. which form a film over the printed circuit board and components in order to provide a protective barrier against corrosion, humidity, and any atmospheric contaminants. The conformal coating also performs an electrical insulating function. The conformal coatings are typically required by military and government specifications. It is known in the art that during the course of printed circuit board assembly, numerous contaminants accumulate as residues on surfaces of the printed circuit board and the electrical and electronic components. The contaminants can also be absorbed into the interior of a printed circuit board. These contaminants include silicone oils, adhesives containing silicone, RTV compounds, finger prints, particulate contaminants, cleaning solution residues, etc. It is known in the art that the typically used conformal coatings do not adhere satisfactorily to surfaces when these contaminants are present. The conformal coatings tend not to wet the contaminated surfaces properly, resulting in a nonuniform distribution of the coating across the various surfaces of the printed circuit board and the electronic components. This results in areas of the board assembly where the coating is not present at all, e.g. pin holes, resulting in the impairment of the integrity of the coating, in that pathways for humidity, contaminants, electrical leakage etc. are present in the coating. The problem is especially pronounced when using automatic conformal coating equipment as evidenced by extremely high quality control rejection rates in the range of 98 %. A printed circuit board assembly having a defective conformal coating must be reprocessed by typically first dipping the board in a hot lye bath to strip the coating and then attempting to reapply the conformal coating. The additional stress of subjecting the board and components to this rework procedure can have detrimental effects on the components and the board. Typically, at least ten percent of the reworked printed circuit board assemblies must be scrapped because of damage sustained during rework.

It is presently known in the art to pretreat printed circuit board assemblies prior to conformal coating operations. This pretreatment typically takes the form of first placing the assemblies in a high purity dionized water bath, next placing the assemblies in a solvent bath such as 1,1,1 -trichloroethane or Freon TM solvent and then dipping in an alcohol bath. However, these pretreatments do not have the ability to sufficiently prepare the surface of the printed circuit board assemblies so that a conformal coating can be applied having satisfactory adherence and absolute integrity.

Presently, in order to compensate for the surface contaminants which remain after pretreating in high purity deionized water, organic solvent, and alcohol, it is necessary to apply the conformal coating by hand with a spray gun to achieve an acceptable coating having integrity. Since the contaminants cause the coating to bead-up rather than flow and adhere to the surfaces, the operator compensates for this phenomenon by applying increased amounts of the coating in those areas of the board having inadequate adhesion, thereby producing a somewhat thicker coating. Although the pretreatment removes silicone and other contaminants from hard surfaces, it has been observed that silicone and similar contaminants are absorbed by printed circuit boards. The printed circuit board is typically a glass fiber-epoxy/phenolic composite; pretreatment does not remove internally absorbed contaminants in these boards which tend to bleed to the surface. The problem present with hand application is that although the coating does have integrity, it is a thicker coating than that which is desired. It is known in the art that the useful life of a coating is related to an optimum thickness. An overly thick coating is undesirable. Also, the coating never actually adheres to the contaminated areas, but the coating forms bridges over those areas containing contaminants. There are several problems associated with this approach. As previously mentioned, it is known that overly thick coatings tend not to adhere to a surface over time. In addition, this method is labor intensive. An automated system is preferred. Finally, even though a coating with integrity is applied by this method, the adhesion to the surface is less than adequate due to the previously mentioned bridging phenomena. This lack of complete adhesion will eventually result in a deterioration of the protective barrier.

It is known in the art to chemically clean and/or wash printed circuit board assemblies prior to applying a coating, however, due to the nature and quantity of contaminants typically present on an assembled printed circuit board, this approach has not produced satisfactory results, especially with automatic coating equipment. Chemically cleaning and/or washing alone is inadequate. The types of chemicals which can be used are limited by the materials used to construct electronic components and printed circuit boards. Attempts at abrading printed circuit board assemblies prior to coating have been similarly unsuccessful. The time delay between the abrasion of the surface and the application of the conformal coating has been observed to result in a bleeding of the contaminants, particularly silicones, from the inner part of the board to the outer surfaces resulting in the previously mentioned problems.

Accordingly, what is needed in this art is an improved method of preparing a surface to receive a coating.

SUMMARY OF THE INVENTION

This invention is a method of simultaneously abrading at least one surface of an article, particularly a circuit board assembly, while simultaneously applying a film-forming composition with a spray gun. The method of this invention comprises introducing abrasive particles (microballons in the case of a circuit board assembly) into a compressed gas supply stream of a spray gun wherein the abrasive particles are entrained in the compressed gas stream and carried to and out of at least one nozzle in the spray gun. A film-forming coating composition stream is also directed to and out of at least one nozzle in the spray gun. The abrasive particle-containing gas stream is then simultaneously sprayed along with the film-forming composition stream from the spray gun such that the film-forming composition and the abrasive particles simultaneously impinge upon at least one surface of the article, thereby abrading the surface and resulting in a film of the coating composition being simultaneously applied to the surface. Substantially all of the abrasive particles are blown off of the surface with the overspray of the spray gun, thereby producing a coating which is relatively free of abrasive particles, which has good adherence and substantially undiminished appearance.

By utilizing the process of this invention it is possible to simultaneously abrade and clean and coat a surface using conventional spraying equipment. The coatings produced by this process have superior adherence and integrity, and it is possible to coat substrates having surface and/or below surface contamination.

The foregoing, and other features and advantages of the present invention, will become more apparent from the following description and accompanying drawing.

BRIEF DESCRIPTION OF THE DRAWING

The FIGURE comprises a flow diagram of a typical process of the present invention.

BEST MODE FOR CARRYING OUT THE INVENTION

The abrasive particles which can be used in the practice of this invention include talcs, carbides, aluminum oxide, various silicas, crushed sand, carborundums, etc. It is preferred in the practice of this invention to use glass microballoons. Glass microballoons are circular hollow glass spheres manufactured by a process such as that disclosed in U.S. Pat. No. 2,978,339 which is incorporated by reference. The glass microballoons are preferred in the practice of this invention since this type of abrasive particle tends to completely shatter into fine particles upon impact with a surface. This produces the desired abrasive effect, and additionally the finely broken particles of the glass microballoons are then substantially blown off of the surface of any article or substrate by the gas overspray of the spray gun. Any residual amounts of glass particles are so fine that they are unnoticeable in the coating and, consequently, do not affect the appearance. A particularly preferred glass micro balloon is ECCOSPHERES TM or Micro Balloons TM brand glass microballoons manufactured by Emerson & Cuming, Division of W. R. Grace & Co., located in Canton, Mass.

The sizes of the particles used in the practice of this invention will typically be about 10 microns to about 50 microns, more typically about 25 microns to about 50 microns, and preferably about 30 microns to about 50 microns in diameter. Although it is preferred to use circular abrasive particles, any shape particle is useful in the practice of this invention as long as the longest dimension falls within the previously recited particle size ranges. Although, as previously mentioned, abrasive particles other than glass microballoons can be used to practice this invention, the disadvantage of using the other particles is that more of the particles would tend to remain in an applied coating since they tend not to shatter.

The coatings which can be used in the practice of this invention include any film-forming compositions. It is preferred when applying conformal coatings to printed circuit board assemblies to use various liquid, resinous film-forming compositions. The resinous film-forming compositions which can be used include urethanes, acrylics, alkyds, epoxys, polyesters, etc. It is particularly preferred to use urethanes and acrylics. An example of a two-component solvent based polyurethane coating which is preferred is Conathane CE-1155 (Parts A & B) brand urethane coating and Conathane S-8 brand solvent manufactured by Conap, Inc., 1405 Buffalo Street, Olean, N.Y. 14760.

Any compressed gas can be used in the practice of this invention. Gases such as nitrogen, air, Freon TM, carbon dioxide, helium, etc. may be used. It is preferred to use compressed air which has been filtered to remove entrained moisture, dirt, oil, etc. The compressed gas will typically be supplied at pressure of about 50 psig. to about 75 psig., more typically about 55 psig. to about 70 psig., and preferably about 55 psig. to about 60 psig.

The objects and substrates which may be coated by the method of this invention include any shape object which can be coated by conventional spray coating equipment. The article may comprise typical materials known in the art such as metals, plastics, glass, alloys, fabrics, wood, composites, etc. The object may have primer coats, etc. applied prior to coating.

The article may have a single surface, several surfaces or a multitude of surfaces. For example, a printed circuit board assembly has the surfaces of the electronic components, wires, leads, board, foil, connectors, etc.

Although the method of this invention is particularly useful in applying conformal coatings to printed circuit board assemblies, it may be used to apply various other types of coatings such as automotive primers, paints, etc. to a variety of substrates while simultaneously abrading those substrates. The thicknesses of the films produced will vary in accordance with the nature of the substrate, and the nature of the coating composition. It is known that in various coating arts different thicknesses of coatings are desirable depending on the application. In conformal coating of electronic components, film thicknesses of about 1 to about 4 mils are desirable. Film thicknesses of about 2 to about 4 mils are preferred. The coatings produced by the method of this invention will typically have a residue of abrasive particulates comprising less than about 30% by weight of the coating composition. More typically the residue will be less than about 2%, and preferably less than about 1%.

The ratio of the amount of abrasive to the amount of coating composition emitted by the spray gun will typically be about 0.05 weight % to about 0.2 weight %, more typically about 0.05 weight % to about 0.15 weight % and preferably about 0.08 weight % to about 0.12 weight %. The coating compositions used in the process of this invention may also include fluorescent dyes such as "Calco Fluor White RP TM" brand dye, manufactured by American Cyanamid Co., Marietta, Ohio to indicate the integrity of the finished coating under a test light. Typically, about 0.001 weight % to about 0.1 weight % of dye is included in the coating composition, preferably about 0.001 weight % to about 0.003 weight %.

The process of this invention may be used to clean many different types of substrates or coated articles. The substrates or articles may comprise metal, painted metal, plastic, wood, various types of coatings, composites or any substrate to which it is desired to adhere a coating and/or clean the substrate.

The FIGURE is a flow diagram showing a typical process according to this invention. Referring to the FIGURE, the process is initiated by supplying compressed gas 10 to optional filtering means 20. Oil, water, dirt, etc. 30 is removed from the gas stream by filtering means 20. The clean compressed gas stream 35 is directed to fluidized bed means 50. Abrasive particles 40 are added to fluidized bed means 50 which comprises a means wherein the gas stream 35 and the abrasive particles 40 are admixed thereby forming abrasive particle-containing gas stream 55 which is then directed to spray gun 70. Coating composition 60 is simultaneously supplied under sufficient pressure and at a sufficient viscosity as a streamto spray gun 70. Spray gun 70 may be a conventional hand held spray gun or it may be an automatic spraying system containing more than one spray gun. Then coating and abrasive spray 80 are directed at substrate 90 resulting in the simultaneous abrading of substrate 90 and application of coating 100. The coating may be either air dried or baked or processed by means known in the art to cure to a hard protective film. In a variation of this method, the stream of coating composition 60 is prevented from being emitted by spray gun 70 and only the abrasive-containing air stream 55 is directed to spray gun 70, resulting in the spray 80 from spray gun 70 containing only abrasive particles entrained in a compressed gas.

The compressed gas will be supplied to the spraying means at sufficient pressure and volumetric flow to enable the spraying means to emit a sufficient amount of abrasive containing gas and to enable the spray gun to function properly with regard to the emission of coating composition.

Typically the compressed gas will be supplied to the spray gun at a pressure of about 25 to about 60 psig., more typically about 50 to about 70 psig., and preferably about 55 to about 60 psig. The volumetric flow rate of compressed gas to the spray gun will typically be about 3 to about 5 CFM ("cubic feet per minute"), more typically about 3 to about 4 CFM, and preferably about 3.5 to about 4 CFM. The quantity of abrasive emitted by the spray gun will be sufficient to sufficiently abrade and clean the surface of an article so that a coating will adequately adhere. The ratio of abrasive particles to coating composition emitted from the spray gun will typically be about 0.05 to about 0.2 weight %, more typically about 0.05 to about 0.15 weight %, and preferably about 0.08 to about 0.12 weight %. Coating composition is supplied to the spray gun at a sufficient pressure, volumetric flow rate, and viscosity to produce coatings of sufficient thickness.

The coating composition will typically be supplied at a pressure of about 50 to about 70 psig., more typically about 55 to about 65 psig., and preferably about 58 to about 60 psig. at a flow rate of typically about 1.0 to about 1.4 cc/second, more typically about 1.0 to about 1.2 cc/second, and preferably about 1.1 to about 1.2 cc/second. Viscosities will typically be about 16 to about 24 cps, more typically about 18 to about 22 cps, and preferably about 19 to about 21 cps at a temperature of about 72° F.

Any type of conventional spray gun may be used in the method of the invention. By "spray gun" is meant any spraying means comprising at least one nozzle for atomizing a coating composition and at least one compressed gas nozzle. The spraying means will preferably comprise a hand-held spray gun or an automatic spraying system containing at least one spray gun. A conventional spray gun typically contains at least one nozzle for the coating composition and at least one nozzle for the compressed gas. The primary function of the compressed gas is to shape the pattern of the emitted coating stream.

Spray 80 will consist of at least one atomized coating composition 60 flow stream and at least one abrasive particle-containing gas stream when optionally simultaneously abrading and coating.

The following examples are illustrative of the principles and practice of this invention although not limited thereto. Parts and percentages where used are parts and percentages by weight.

EXAMPLE 1

Printed circuit board assemblies were prepared by pretreating in a hot vapor degreaser maintained at a temperature of about 117° F. to about 163° F. The degreasing agent used was either Freon TM solvent or 1,1,1,-trichloroethane. The assemblies were then washed in a deionized water bath maintained at about 160° F. The printed circuit board assemblies were next treated by immersion in an alcohol bath containing isopropyl alcohol at a temperature of about 70° F. The assemblies were then baked in a conventional oven at a temperature of about 180° F. for about one-half hour. The assemblies were next placed into an automatic coating unit. The coating unit was manufactured by Integrated Technologies, Achnet, MA, spray unit model CM2332. Dry, clean, compressed air at a pressure of about 15 to 65 psig. was fed to this unit. Glass microballoons were charged to a mixing reservoir (i.e., fluidized bed) in the unit in the path of the compressed gas stream such that sufficient amounts of abrasive glass beads were entrained in the compressed gas stream. The abrasive glass microballoons were manufactured by Emerson & Cuming and had an average diameter of about 30 microns to about 50 microns, and a density of about 0.29 gram/cc to about 0.3 gram/cc. A urethane coating composition was fed to the coating apparatus. The coating composition consisted of a two-part system urethane coating manufactured by Conap, Inc., Olin, N.Y. Specifically 1000 parts of Part A, Conap brand CE-1155 were mixed with 70 parts of Part B, Conap brand CE-1155 and 34 parts of Conap brand S-8 to form the coating composition.

The ooating composition was fed to the spray unit as a stream at a pressure of about 70 psig., a flow rate of about 1.2 cc/sec. and a viscosity of about 20 CPS at 72° F.

The printed circuit board assemblies were approximately 12 inches by 12 inches in size and contained various amounts and types of electronic components. The printed circuit board assemblies were simultaneously abraded and coated in the unit at a rate of about 7½ linear inches per minute. After coating, the boards were then baked in a conventional oven at a temperature of about 200° F. for about 15 minutes to cure the coating composition. The thickness of the coatings ranged from about 2 mils to about 3 mils. The percentage of acceptable coatings was found to be about 98%. The coatings were uniformly thick and substantially free from defects such as dewetting, thin areas, voids, etc. There were no residual abrasive particles obervable with the naked eye.

EXAMPLE 2

The process of Example 1 was repeated except that no abrasive was utilized in the air stream of the coating apparatus. It was observed that about 70% of the printed circuit board assemblies had a defective conformal coating as evidenced by voids, dewetted areas, and thin areas in the coating.

EXAMPLE 3

The process of Example 1 is repeated except that no coating composition is fed to the spray guns. It is observed that the circuit boards are abraded clean and suitable to accept a conformal coating.

The method of the present invention provides a process wherein a coating composition and an abrasive particle-containing air stream can be simultaneously directed to the surface of an article using conventional spraying means. The coatings produced are substantially free of abrasive particles. The disadvantages of the conventional cleaning and abrading methods are eliminated in that there is no time delay between the abrasion of the surface and the application of the coating, thereby permitting the coating to adhere to a clean surface, while locking-in below-surface contaminants. The coatings have good appearance, integrity and adherence. The appearance of the coatings is substantially undiminished since a majority of the abrasive particles are blown away during the process and not retained in the coating.

The method of the present invention also provides a means for cleaning surfaces with abrasives using conventional spray guns thereby preparing the surfaces to receive a coating.

Although this invention has been shown and described with respect to detailed embodiments thereof, it will be understood by those skilled in the art that various changes in form and detail thereof may be made without departing from the spirit and scope of the claimed invention.

We claim:

1. A method of simultaneously abrading at least one surface of a circuit board assembly and applying a film-forming coating composition thereto with a spray gun having a compressed gas stream supply and a film-forming composition stream supply, comprising
    introducing glass microballoons into the compressed gas stream supply of the spray gun, such that the glass microballoons are entrained in the compressed gas stream and carried by the gas stream to and out of at least one spray nozzle in the spray gun; and directing the film-forming coating composition stream to and out of at least one spray nozzle in the spray gun such that the glass microballons are simultaneously sprayed along with the film-forming composition from the spray gun, resulting in the film-forming coating composition and the glass microballoons simultaneously impinging upon at least one surface of the circuit board assembly,
thereby abrading the surface and resulting in a film of the coating composition being simultaneously applied to the surface, wherein substantially all of the glass microballoons are blown off the surface by the compressed gas stream, thereby producing a coating which is substantially free of glass microballoons and is adherent to the surface of the assembly.

2. The method of claim 1, wherein the glass microballoons have a diameter of about 30 to about 50 microns.

3. The method of claim 1, wherein the coating composition is a resinous film-forming coating composition.

4. The method of claim 3 wherein the resinous coating composition is selected from the group consisting of urethane, acrylic, epoxy, and alkyd resins.

* * * * *